(12) United States Patent
Ho et al.

(10) Patent No.: US 6,646,868 B2
(45) Date of Patent: Nov. 11, 2003

(54) COMPUTER BUS RACK HAVING AN INCREASED DENSITY OF CARD SLOTS

(75) Inventors: Raymond K. Ho, San Jose, CA (US); Victor E. Jochiong, Mill Valley, CA (US); Richard R. Creason, Palo Alto, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 65 days.

(21) Appl. No.: 09/873,825

(22) Filed: Jun. 4, 2001

(65) Prior Publication Data

US 2002/0181194 A1 Dec. 5, 2002

(51) Int. Cl.$^7$ .................................................. G06F 1/16
(52) U.S. Cl. ........................ 361/684; 361/752; 361/748; 312/223.1; 312/223.2
(58) Field of Search ................................ 361/802, 804, 361/684–687, 700, 704, 707, 724–727; 312/223.1, 223.2, 265.2, 334.31

(56) References Cited

U.S. PATENT DOCUMENTS

| | | | | |
|---|---|---|---|---|
| 4,984,133 | A | * | 1/1991 | Casanova et al. ........... 361/683 |
| 5,023,754 | A | * | 6/1991 | Aug et al. .................. 361/748 |
| 5,031,075 | A | * | 7/1991 | Casanova et al. ........... 361/683 |
| 6,073,229 | A | | 6/2000 | Crane, Jr. et al. |
| 6,208,522 | B1 | * | 3/2001 | Manweiler et al. ......... 361/727 |
| 6,411,506 | B1 | * | 6/2002 | Hipp et al. ................. 174/261 |
| 6,411,520 | B1 | * | 6/2002 | Hauke et al. ............... 361/730 |
| 6,418,026 | B1 | * | 7/2002 | Ho et al. .................. 360/98.01 |

FOREIGN PATENT DOCUMENTS

EP          0 438 012        7/1991

* cited by examiner

*Primary Examiner*—Darren Schuberg
*Assistant Examiner*—Anthony Q. Edwards
(74) *Attorney, Agent, or Firm*—O'Melveny & Myers LLP (57) ABSTRACT

A computer bus rack includes at least one circuit board. The circuit board has an increased density of add-on card slots, with the at least one circuit board having a front side and a back side, and the rack comprising a first plurality of slots coupled to the front side, and a second plurality of slots coupled to the back side. The first and second plurality of slots are arranged such that corresponding ones of the first and second slots are in substantial alignment, respectively. Also provided are a plurality of connectors having respective connector-pins extended in a direction substantially perpendicular to and away from the circuit board and having a column and row arrangement within the connectors. The connectors are affixed to the circuit board in alignment with the first and second plurality of slots, and each one of the plurality of connectors has connector-pins that are physically distinct from connector-pins of connectors of the other slots. Note that the slots on the front side and the back side are adapted to mate with add-on cards so as to increase the amount of add-on slots for a given form factor.

16 Claims, 10 Drawing Sheets

COMPUTER BUS RACK HAVING AN INCREASED DENSITY OF CARD SLOTS

BACKGROUND OF THE INVENTION

1. Field of the Invention

The present invention relates to a computer bus rack having an increased density of card slots. More specifically, the present invention relates to increasing the density of card slots in a CPCI system.

2. Description of Related Art

Compact Peripheral Component Interconnect ("CPCI") is a high performance industrial bus based on the standard PCI electrical specification in rugged 3U or 6U Eurocard packaging. CPCI is intended for application in telecommunications, computer telephony, real-time machine control, industrial automation, real-time data acquisition, instrumentation, military systems or any other application requiring high speed computing, modular and robust packaging design, and long term manufacturer support. Because of its extremely high speed and bandwidth, the CPCI bus is particularly well suited for many high-speed data communication applications such as servers, routers, converters, and switches.

Compared to standard desktop PCI, CPCI supports twice as many PCI slots (8 versus 4) and offers a packaging scheme that is much better suited for use in industrial applications. Conventional CPCI cards are designed for front loading and removal from a card cage. The cards are firmly held in position by their connector, card guides on both sides, and a faceplate that solidly screws into the card cage. Cards are mounted vertically allowing for natural or forced air convection for cooling. Also, the pin-and-socket connector of the CPCI card is significantly more reliable and has better shock and vibration characteristics than the card edge connector of the standard PCI cards.

Conventional CPCI defines a backplane environment that is limited to eight slots. More specifically, the bus segment of the conventional CPCI system is limited to eight slots, which includes a system slot and peripheral slots. The system slot provides the clocking, arbitration, configuration, and interrupt processing for up to seven peripheral slots. However, many applications require larger systems so that it would be advantageous to provide a higher density of slots for a given form factor.

SUMMARY OF THE INVENTION

The present invention relates to a computer bus rack including a circuit board that is adapted to have an increased density of add-on card slots for a given form factor. Important advantages and benefits are realized by providing a higher density of card slots for a computer bus rack such as a CPCI system. If the system of the present invention allows for a greater number of "intelligent" cards (i.e., cards having a microprocessor or a digital signal processor) to be inserted in the additional slots, then the system's processing power is effectively increased, and more clients can be served. If more "slave" cards (i.e., cards having an I/O processor such as Ethernet, and serial and/or parallel ports or a storage control processor such as Small Computer System Interface (SCSI), and fiberchannel) are inserted in the additional slots, then the system's I/O or storage capabilities are effectively increased, and more clients can be served. Either scheme also allows for a myriad of application enhancements such as multiple communication links, disk mirroring, flexible peer-to-peer transactions, and parallel and/or distributed processing. Note that the present invention is able to realize the above benefits without any increase in the physical size of the system.

In an embodiment of the invention, a computer bus rack includes at least one circuit board having a front side and a back side, and the rack comprising a first plurality of slots coupled to the front side, and a second plurality of slots coupled to the back side. The first and second plurality of slots are arranged such that corresponding ones of the first and second slots are in substantial alignment, respectively. Also, a plurality of connectors having respective connector-pins are extended in a direction substantially perpendicular to and away from the circuit board and having a column and row arrangement within the connectors. The connectors are affixed to the circuit board in alignment with the first and second plurality of slots, and each one of the plurality of connectors has connector-pins that are physically distinct from connector-pins of connectors of the other slots. Note that in the present embodiment, the slots on the front side and the back side are adapted to mate with add-on cards so as to increase the amount of add-on slots for a given form factor.

In another embodiment of the invention, a computer chassis for housing a computer bus rack is provided. The computer chassis comprises a front and rear card cage, where each of the card cages include vertical side panels parallel to each other and spaced apart, top and bottom support members parallel with respect to each other and connected to the side panels at the top and bottom of the panels, respectively, and in a direction substantially perpendicular to the panels. Also included are pairs of card guides coupled to the top and bottom support members and extended perpendicular to the support members, wherein each of the pairs of card guides includes a first card guide coupled to the top support member and a second card guide coupled to the bottom support member. Further, a board slot is located at substantially a middle portion of the chassis and in between the first and second card cages. The present embodiment is able to accommodate the computer bus rack of the present invention at the middle of the chassis instead of the back of the chassis as in the prior art. This allows for insertion of add-on cards through the front or back of the chassis. The card guides are also provided and arranged within the chassis such that the add-on cards are able to mate properly with slots of the computer bus rack.

In another embodiment of the invention, a table for holding a circuit board having connectors with connector-pins is provided. The table comprises a top surface, a bottom surface beneath the top surface, and a plurality of side surfaces disposed between the top and bottom surfaces, wherein the top surface has grooves in a direction parallel to one side surface of the table. The grooves provide a clearance for the connectors of the circuit board such that the connectors fit within the grooves, and the remaining portions of the top surface provide support to the circuit board. The present embodiment allows for press fitting of connectors to a circuit board having a single midplane implementation. For example, if there is only one midplane and the connectors are to be press-fitted on both sides of the midplane, a table as described in the present embodiment is required so that there is clearance for the already press-fitted connectors when connectors are being press-fit on another side of the midplane.

A more complete understanding of the present invention will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION

The present invention relates to a computer bus rack including a circuit board that is adapted to have an increased density of add-on card slots for a given form factor. There are important advantages and benefits to providing a higher density of card slots for a computer bus rack such as a CPCI system. If the system of the present invention allows for a greater number of "intelligent" cards (i.e., cards having a microprocessor or a digital signal processor) to be inserted in the additional slots, then the system's processing power is effectively increased, and more clients can be served. If more "slave" cards (i.e., cards having an I/O processor such as Ethernet, and serial and/or parallel ports or a storage control processor such as Small Computer System Interface (SCSI), and fiberchannel) are inserted in the additional slots, then the system's I/O or storage capabilities are effectively increased, and more clients can be served. Either scheme also allows for a myriad of application enhancements such as multiple communication links, disk mirroring, flexible peer-to-peer transactions, and parallel and/or distributed processing. For example, if boards having DSP processors are inserted in the slots of the computer bus rack, then more powerful distributed processing can be conducted, and if boards having Ethernet controllers are inserted in the slots, then communications links are provided in the system, and so on. Note that the present invention is able to realize the above benefits without any increase in the physical size of the system.

Figure 1:
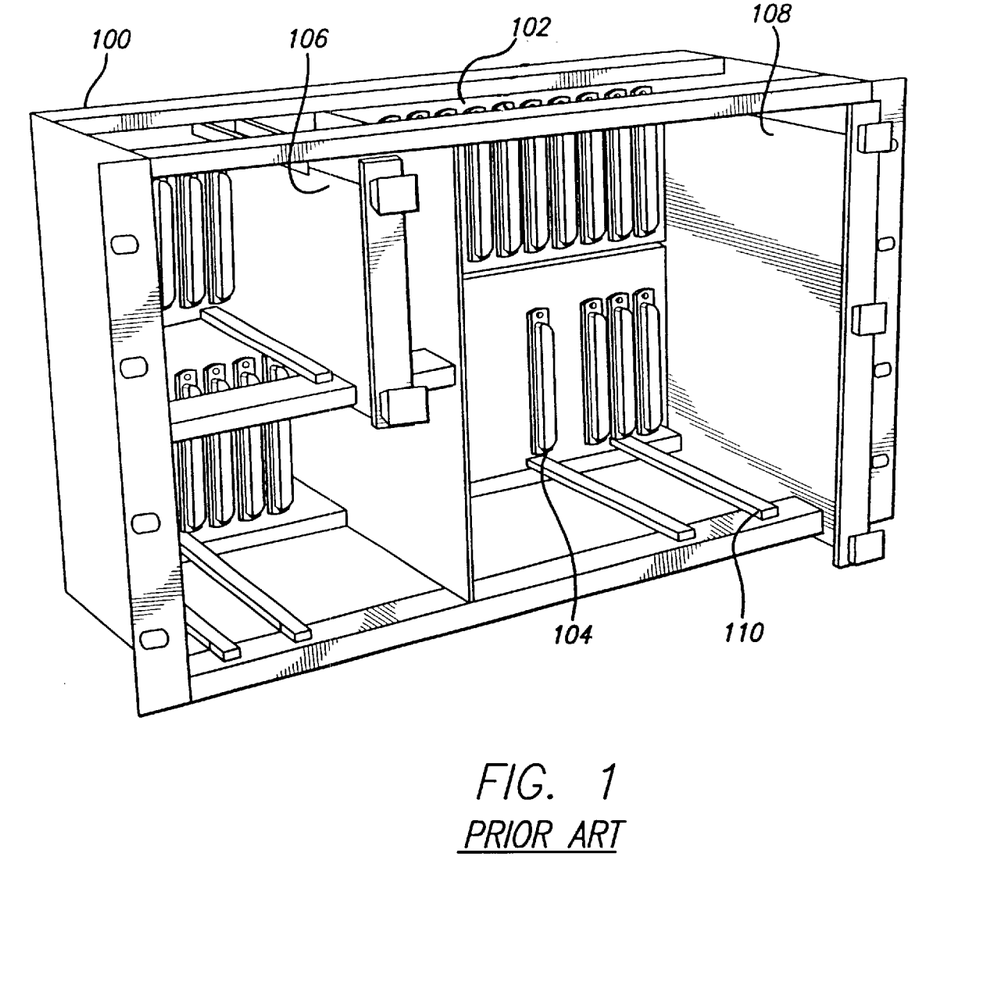
FIG. 1 is a perspective view of a conventional CPCI chassis system.

Referring to FIG. 1, there is shown a perspective view of a conventional CPCI chassis system. The chassis system 100 includes a CPCI circuit board referred to in the conventional CPCI system as a passive backplane 102 since the circuit board is located at the back of the chassis 100 and add-on cards can only be inserted from the front of the chassis 100. On the front side of the backplane 102 are slots provided with connectors 104. In the conventional chassis system 100 that is shown, a 3U daughter card 106 or a 6U daughter card 108 may be inserted into appropriate slots and mate with the connectors 104. For proper insertion of the daughter cards 106, 108 into the slots, card guides 110 are provided. This conventional chassis system 100 provides front removable daughter cards and unobstructed cooling across the entire set of daughter cards 106, 108.

Figure 2:
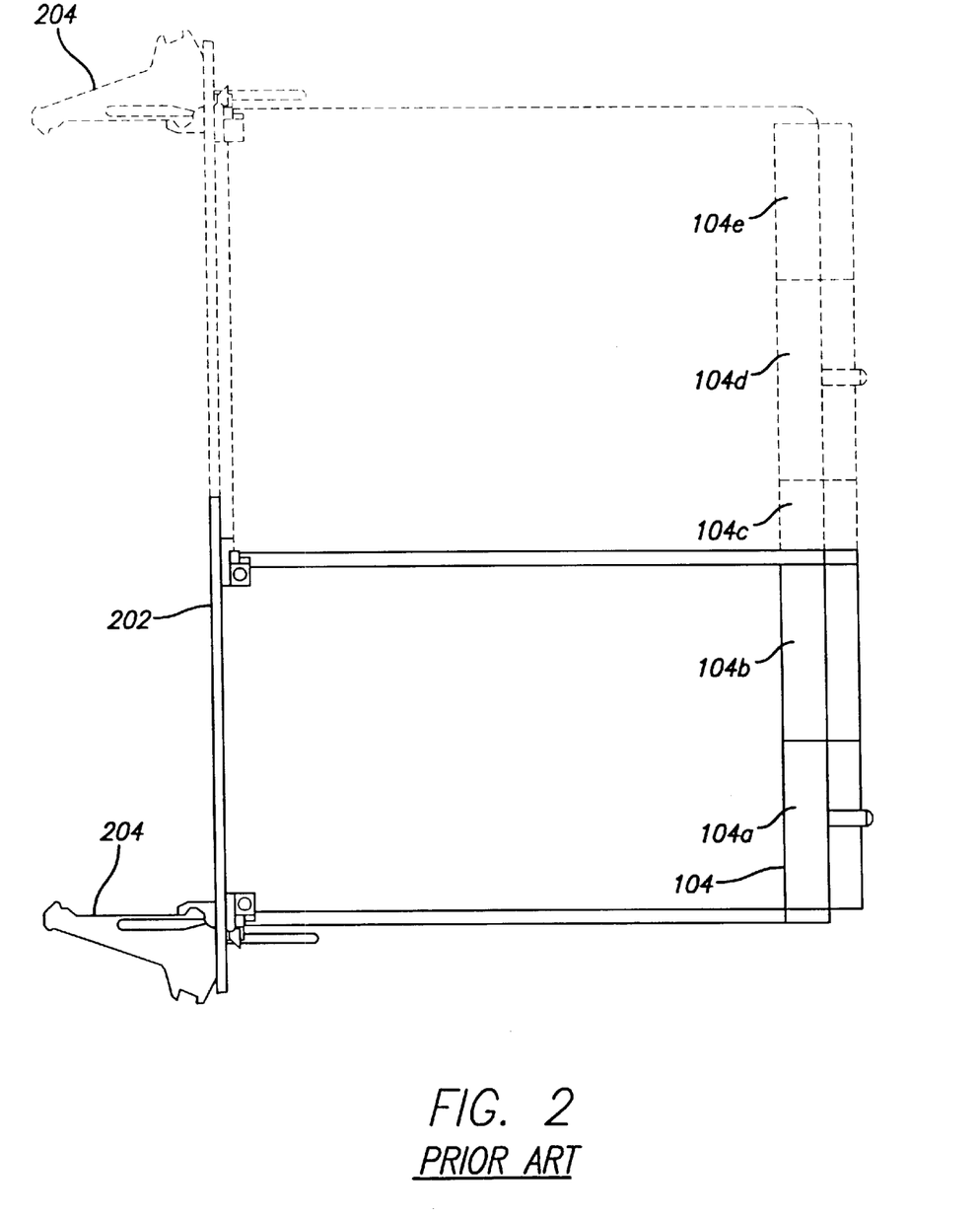
FIG. 2 shows the form factor that is defined for the CPCI daughter card.

Referring to FIG. 2, there is shown the form factor defined for the CPCI daughter card, which is based on the Eurocard industry standard. As shown in FIG. 2, the daughter card 200 has a front plate interface 202 and ejector/injector handles 204. The front plate interface 202 is consistent with Eurocard packaging and is compliant with IEEE 1101.1 or IEEE 1101.10. The ejector/injector handles should also be compliant with IEEE 1101.1. One ejector/injector handle 204 is used for 3U daughter cards, and two ejector/injector handles 204 are used for 6U daughter cards. Note that the connectors 104a–104e are numbered starting from the bottom connector 104a, and that both 3U and 6U daughter card sizes are defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b, and is the minimum as it accommodates the full 64 bit CPCI bus. Specifically, the 104a connectors are reserved to carry the signals required to support the 32-bit PCI bus, hence no other signals may be carried in any of the pins of this connector. Optionally, the 104a connectors may have a reserved key area that can that be provided with a connector "key", which is a pluggable plastic piece that comes in different shapes and sizes, so that the add-on card can only mate with an appropriately keyed slot. The 104b connectors are defined to facilitate 64-bit transfers or for rear panel I/O in the 3U form factor. The 104c–104e connectors are available for 6U systems as shown in FIG. 1. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (i.e., Signal Computing System Architecture (SCSA) or MultiVendor Integration Protocol (MVIP) telephony buses), bridges to other buses (i.e., Virtual Machine Environment (VME) or Small Computer System Interface (SCSI)), or for user specific applications. Note that the CPCI specification defines the locations for all the connectors 104a–104e, but only the signal-pin assignments for the CPCI bus portion 104a and 104b are defined. The remaining connectors are the subjects of additional specification efforts, or can be user defined for specific applications, as described above.

Figure 3:
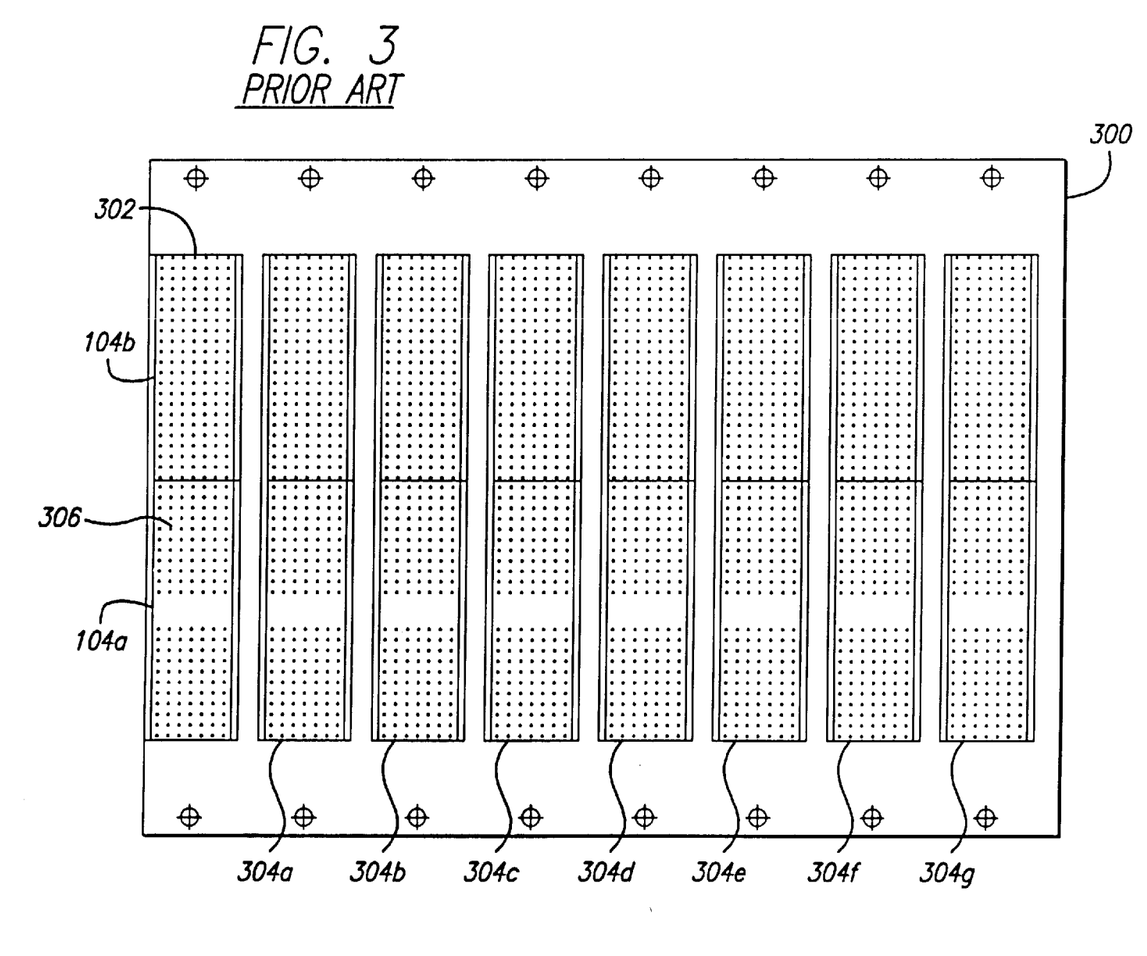
FIG. 3 is a front view of a conventional 3U backplane having eight slots with two connectors each.

Referring to FIG. 3, there is shown a front view of a conventional 3U backplane having eight slots with two connectors each. A CPCI system is composed of one or more CPCI bus segments, where each bus segment includes up to eight CPCI card slots. Each CPCI bus segment consists of one system slot 302, and up to seven peripheral slots 304a–304g. The CPCI daughter card for the system slot 302 provides arbitration, clock distribution, and reset functions for the CPCI peripheral cards on the bus segment. The peripheral slots 304a–304g may contain simple cards, intelligent slaves or PCI bus masters.

The connectors 104a, 104b have connector-pins 306 that project in a direction perpendicular to the backplane 300, and are designed to mate with the front side "active" daughter cards 106, 108 (see FIG. 1), and "pass-through" its relevant interconnect signals to mate with the rear side "passive" input/output (I/O) card(s) (not shown). In other words, in the conventional CPCI system, the connector-pins 306 allow the interconnected signals to pass-through from the active front side daughter cards to the rear side passive I/O cards.

Figure 4A:
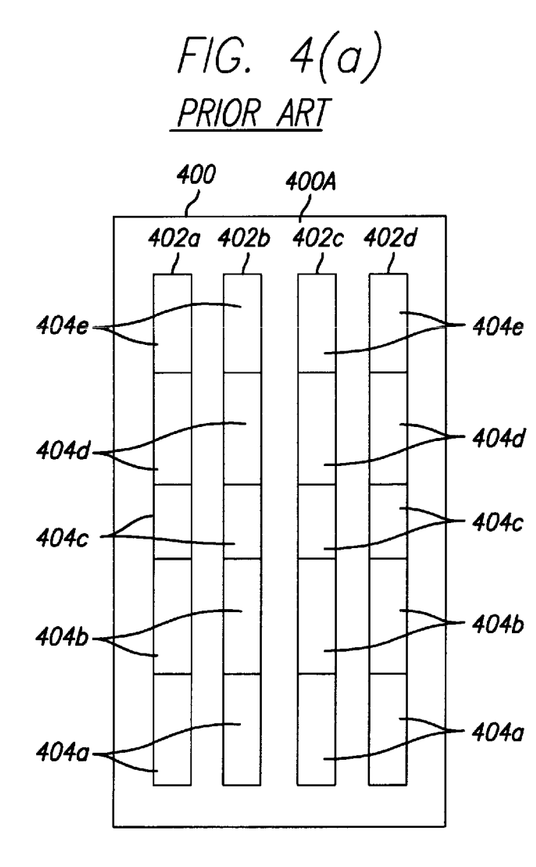
FIG. 4(a) shows a front view of a conventional CPCI backplane in the 6U form factor.
Figure 4B:
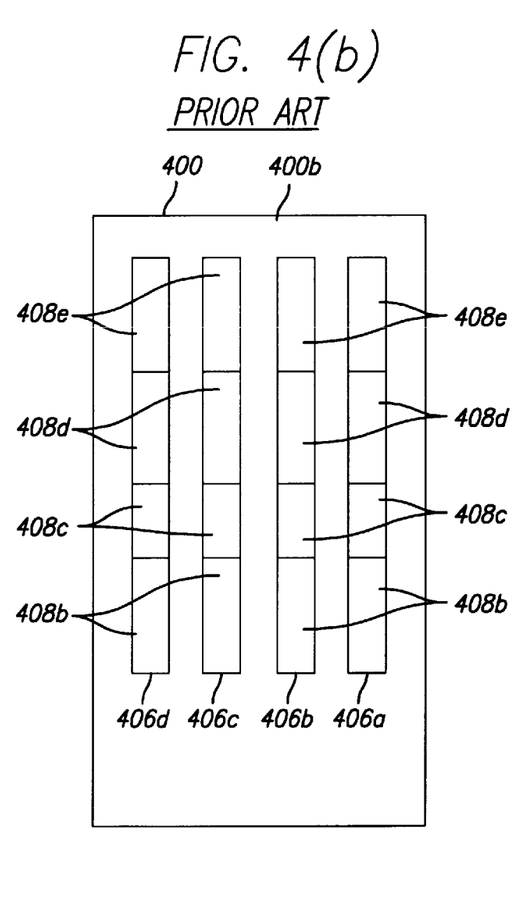
FIG. 4(b) shows a back view of a conventional CPCI backplane in the 6U form factor.

Referring to FIGS. 4(a) and 4(b), there are shown a front and back view of a conventional CPCI backplane in the 6U form factor, respectively. In FIG. 4(a), four slots 402a–402d are provided on the front side 400a of the backplane 400. In FIG. 4(b), four slots 406a–406d are provided on the back side 400b of the backplane 400. Note that in both FIGS. 4(a) and 4(b) only four slots are provided instead of eight slots as in FIG. 3. Further, it is important to note that each of the slots 402a–402d on the front side 400a has five connectors 404a–404e while each of the slots 406a–406d on the back side 400b has only four connectors 408b–408e. This is because, as in the 3U form factor of the conventional CPCI system, the 404a connectors are provided for 32 bit PCI and connector keying. Thus, they do not have I/O connectors to their rear. Accordingly, the daughter cards that are inserted in the front side slots 402a–402d only transmit signals to the rear transition cards that are inserted in the back side slots 406a–406d through front side connectors 404b–404e.

Figure 5:
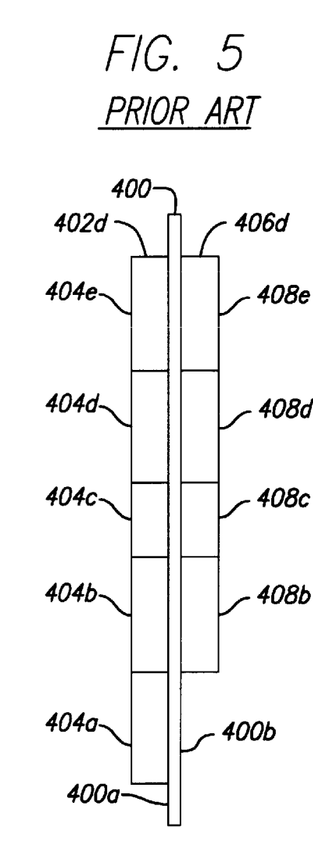
FIG. 5 shows a side view of the conventional backplane of FIGS. 4(a) and 4(b)

Referring to FIG. 5, there is shown a side view of the conventional backplane of FIGS. 4(a) and 4(b). As shown in FIG. 5, slot 402d on the front side 400a and slot 406d on the back side 400b are arranged to be substantially aligned so as to be back to back. Further, slot 402c on the front side 400a and slot 406c on the backside 400b are arranged to be substantially aligned, and so on. Accordingly, the front side connectors 404b–404e are arranged back-to-back with the back side connectors 408b–408e. Note that the front side connector 404a does not have a corresponding back side connector. It is important to note that the system slot 402a is adapted to receive the CPU daughter card, and the signals from the system slot 402a are then transmitted to corresponding connector-pins of the peripheral slots 402b–402d. Thus, the conventional CPCI system can have expanded I/O functionality by adding peripheral daughter cards in the peripheral slots 402b–402d.

Because the connector-pins 306 in the conventional CPCI system allow the interconnected signals to pass-through from the daughter cards to the rear side passive I/O cards, the maximum number of slots that can be provided for a backplane 400 that conforms to the Eurocard industry standard is limited to eight. In other words, the conventional CPCI system is limited in how many slots can be provided for a given backplane 400.

The present invention overcomes this disadvantage of the conventional CPCI system by providing additional back side connectors for mating with additional CPCI daughter cards by providing a connector-pin arrangement that is essentially a mirror image of the front side connectors onto the rear side of the circuit board, and which do not pass-through the signals onto the connector at its rear. This allows for essentially doubling of the number of slots that can support CPCI daughter cards for a given form factor of a midplane, as described in more detail below.

Figure 6A:
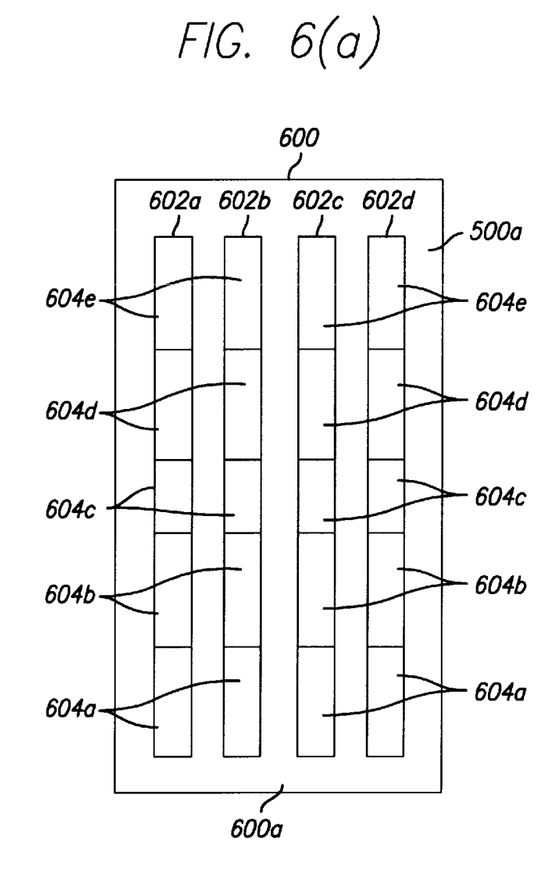
FIG. 6(a) shows a front view of a midplane according to an embodiment of the invention.
Figure 6B:
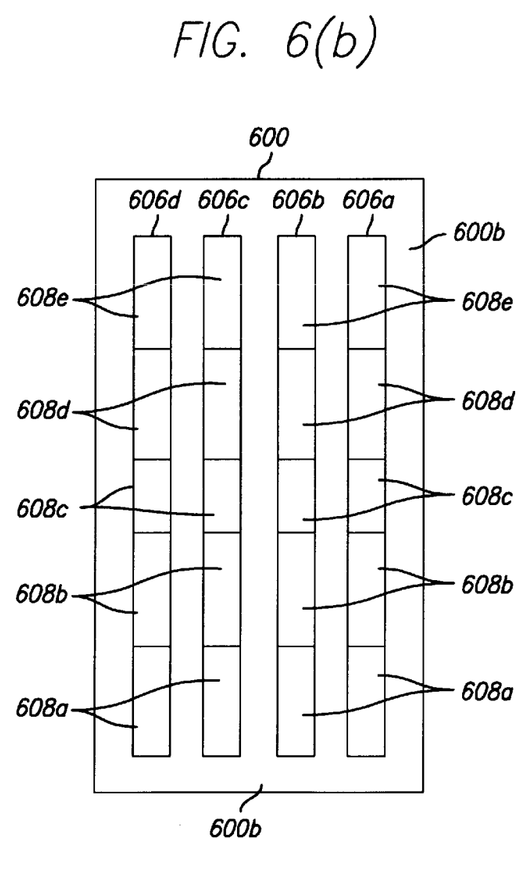
FIG. 6(b) shows a back view of a midplane according to an embodiment of the invention.
Figure 6C:
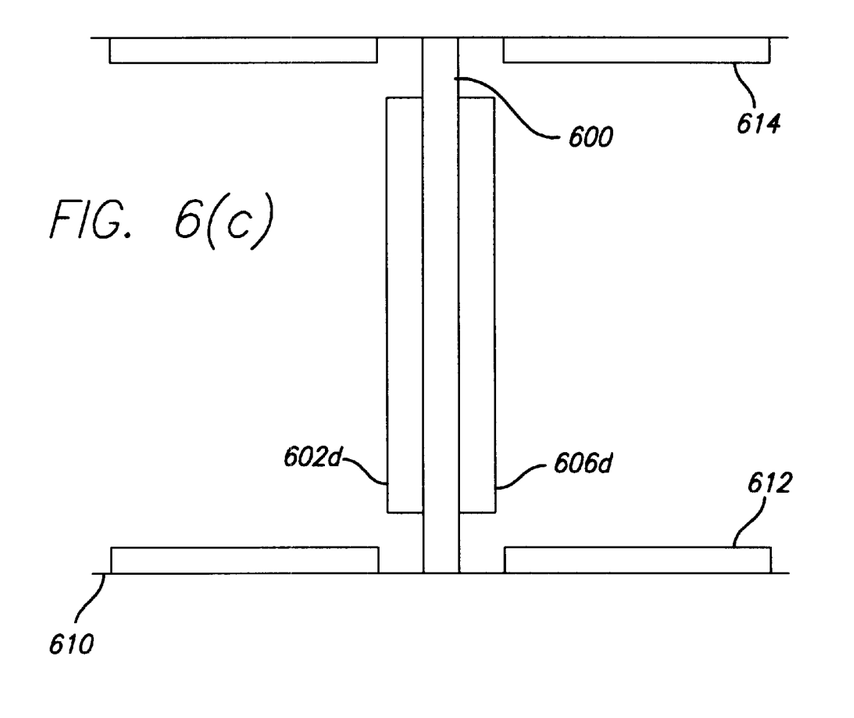

FIGS. 6(a) and 6(b) show a front and back view of a midplane according to an embodiment of the invention. Note that in the present invention, the CPCI circuit board is referred to as the midplane because it is preferably located in the middle of the chassis, and is able to have add-on cards inserted from the front and back. For example, referring to FIG. 6(c), which shows a side view of a chassis according to an embodiment of the invention, the midplane 600 is located at the middle of the chassis 610 having bottom and top guides 612, 614. However, it should be noted that the midplane 600 of the present invention may be located in any suitable place on the CPCI chassis.

Referring to FIG. 6(a), on the front side 600a of the midplane 600, there are provided four slots 602a–602d having five connectors 604a–604e each. As shown in FIG. 6(b), on the back side 600b of the midplane 600, there are also provided four slots 606a–606d having five connectors 608a–608e each. Note that by providing four slots on the front side 600a and back side 600b of the midplane 600, the present invention has a total of eight slots that are capable of mating with CPCI daughter cards, and not four as in the conventional CPCI system shown in FIGS. 4(a) and 4(b). In other words, in the conventional CPCI system of FIGS. 4(a) and 4(b), the CPCI daughter cards can only be inserted in the slots of the front side, and I/O transition cards are inserted in the slots of the back side. Accordingly, the I/O transition cards are not supported in the back side slots of the present invention as in the conventional CPCI system, and the present invention is able to provide a higher density of add-on slots for a given form factor.

Figure 7:
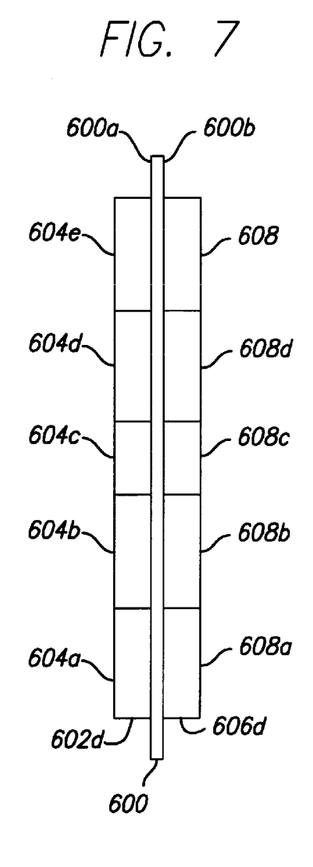
FIG. 7 shows a side view of the midplane of FIGS. 6(a) and 6(b)

Referring to FIG. 7, there is shown a side view of the midplane of FIGS. 6(a) and 6(b). As illustrated in the example of FIG. 7, the slot 602d on the front side 600a and slot 606d on the back side 600b are arranged to be substantially aligned so as to be back to back. Further, slot 602c on the front side 600a and slot 606c on the back side 600b are arranged to be substantially aligned, and so on.

Figure 8:
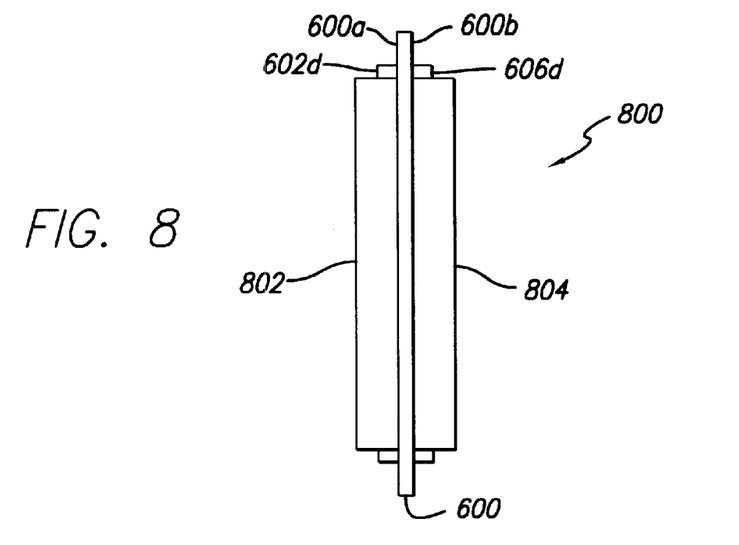
FIG. 8 shows a side view of the midplane of FIGS. 6(a) and 6(b) where each slot on the front and back side has a CPCI daughter card inserted therein.

Referring to FIG. 8, there is shown a side view of the midplane of FIGS. 6(a) and 6(b) where each slot on the front and back side has a CPCI daughter card inserted therein. As shown in the example of FIG. 8, CPCI daughter cards 802, 804 are inserted in slot 602d and slot 606d, respectively, of the midplane 600. Although not shown, other CPCI daughter cards are insertable in slots 602a–602c of the front side and slots 606a–606c of the back side. As shown in the examples of FIGS. 7 and 8, the midplane 600 is able to accommodate twice as many CPCI daughter cards as in the conventional CPCI system for a given form factor.

Figure 9A:
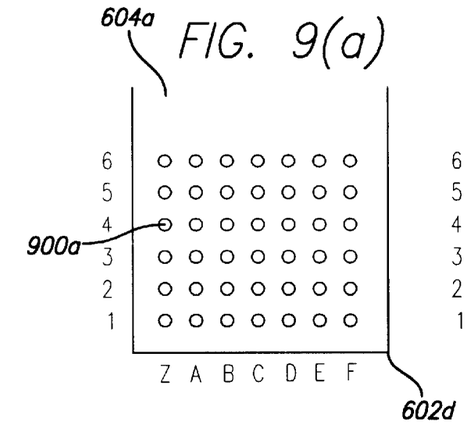
FIG. 9(a) shows an arrangement of the connector-pins of the front side connectors according to an embodiment of the invention.
Figure 9B:
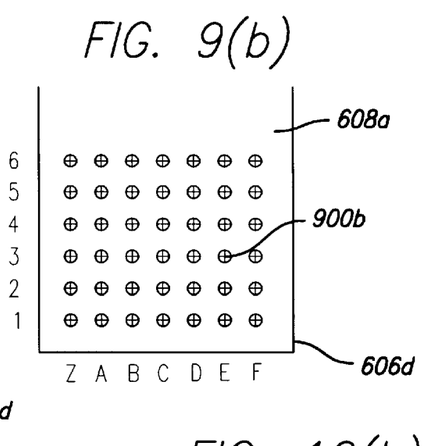
FIG. 9(b) shows an arrangement of the connector-pins of the back side connectors according to an embodiment of the invention.

Referring to FIGS. 9(a) and 9(b), there are shown the arrangement of the connector-pins of the front side and back side connectors according to an embodiment of the invention. As shown in FIGS. 9(a) and 9(b), the connector 604a and connector 608a have a column and row arrangement of connector-pins 900a and 900b, respectively. Further, note that when the slot 602d of the front side 600a is substantially aligned so as to be back-to-back with the slot 606d of the back side 600b, connector-pin 900a located at column Z row 2 of the front side connector 604a is not located back-to-back with the corresponding connector-pin 900b located at column Z, row 2 of the back side connector 608a. In other words, the connector-pins 900a, 900b of connectors 604a and 608a, respectively, are not straight pass-through pins. Similarly, the connectors 604b–604e of the front side slots also do not share straight pass-through connector-pins with connectors 608b–608e of the back side slots, respectively. For example, when the slot 602d of the front side 600a is provided back-to-back with the 606d of the back side 600b, connector-pin located at column Z, row 2 of the front connector 604a has substantially at its rear the connector-pin located at column F, row 2 of the rear connector 608a. Thus, the connector-pins 900a, 900b of connectors 604a, 608a, respectively, are not straight pass-through pins, but are instead separate and distinct pins. Similarly, the connectors 604b–604e and 608b–608e also do not share their connector-pins between each other, respectively. Accordingly, the connector-pins 900a of the front side connectors are designed to mate with CPCI daughter cards and the connector-pins 900b of the back side connectors are also designed to mate with CPCI daughter cards, and not I/O transition cards.

Figure 10A:
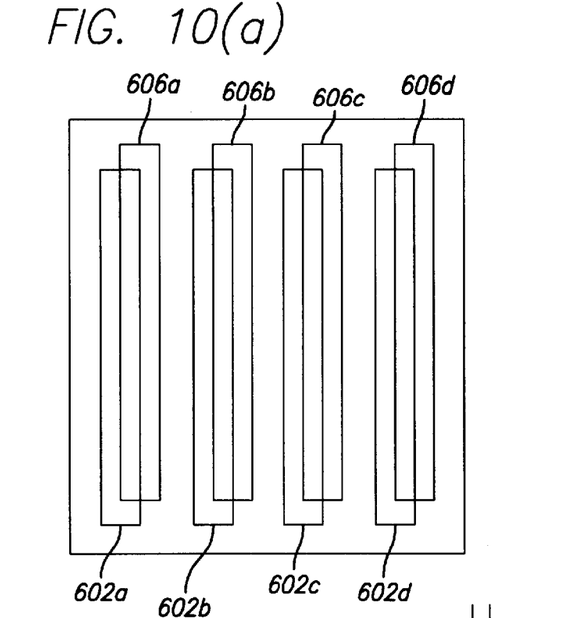
FIG. 10(a) shows an overlapped view of the respective slots of a single midplane implementation according to an embodiment of the invention.
Figure 10B:
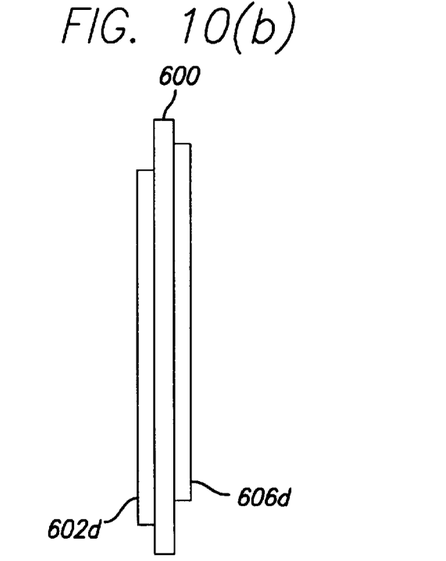
FIG. 10(b) shows a side view of the midplane of FIG. 10(a)
Figure 10C:
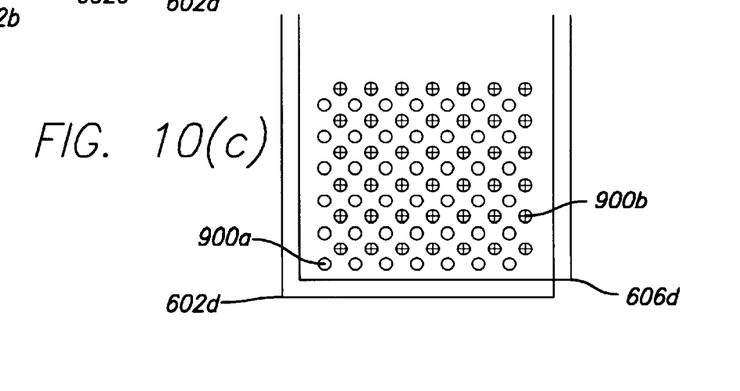
FIG. 10(c) shows a detailed view of the connectors of the midplane of FIG. 10(a)

FIGS. 10(a)–10(c) show a single midplane implementation of an embodiment of the present invention. Specifically, FIG. 10(a) illustrates an overlapped view of the front and back side slots of the midplane of FIGS. 6(a) and 6(b). Referring to FIG. 10(a), there are shown front side slots 602(a)–602(d) and back side slots 606(a)–606(d), substantially aligned, but being substantially offset in both a vertical direction and a horizontal direction with respect to slots on the other side, respectively. FIG. 10(b) shows a side view of the offset slots of FIG. 10(a). Referring to FIG. 10(b), there is shown one midplane 600 with slots 602d and 606d on its front and back sides, respectively. From this view, only the offset with respect to the vertical direction can be seen. Although not shown, note that the other slots 602a–602c and 606a–606c are similarly offset with respect to each other. FIG. 10(c) shows a detailed view of connectors of the offset slots of FIG. 10(a). Referring to FIG. 10(c), slot 602d has connector-pins 900a in a column and row arrangement. Similarly, slot 606d has connector-pins 900b in a column and now arrangement. As can be seen from FIG. 10(c), because slot 602d and 606d are offset in a vertical and horizontal direction with respect to each other, the connector-pins 900a and 900b are also offset in a vertical and horizontal direction with respect to each other. Thus, it can be clearly seen that the front side connector-pins 900a and back side connector-pins 900b are not straight pass-through pins.

Figure 10D:
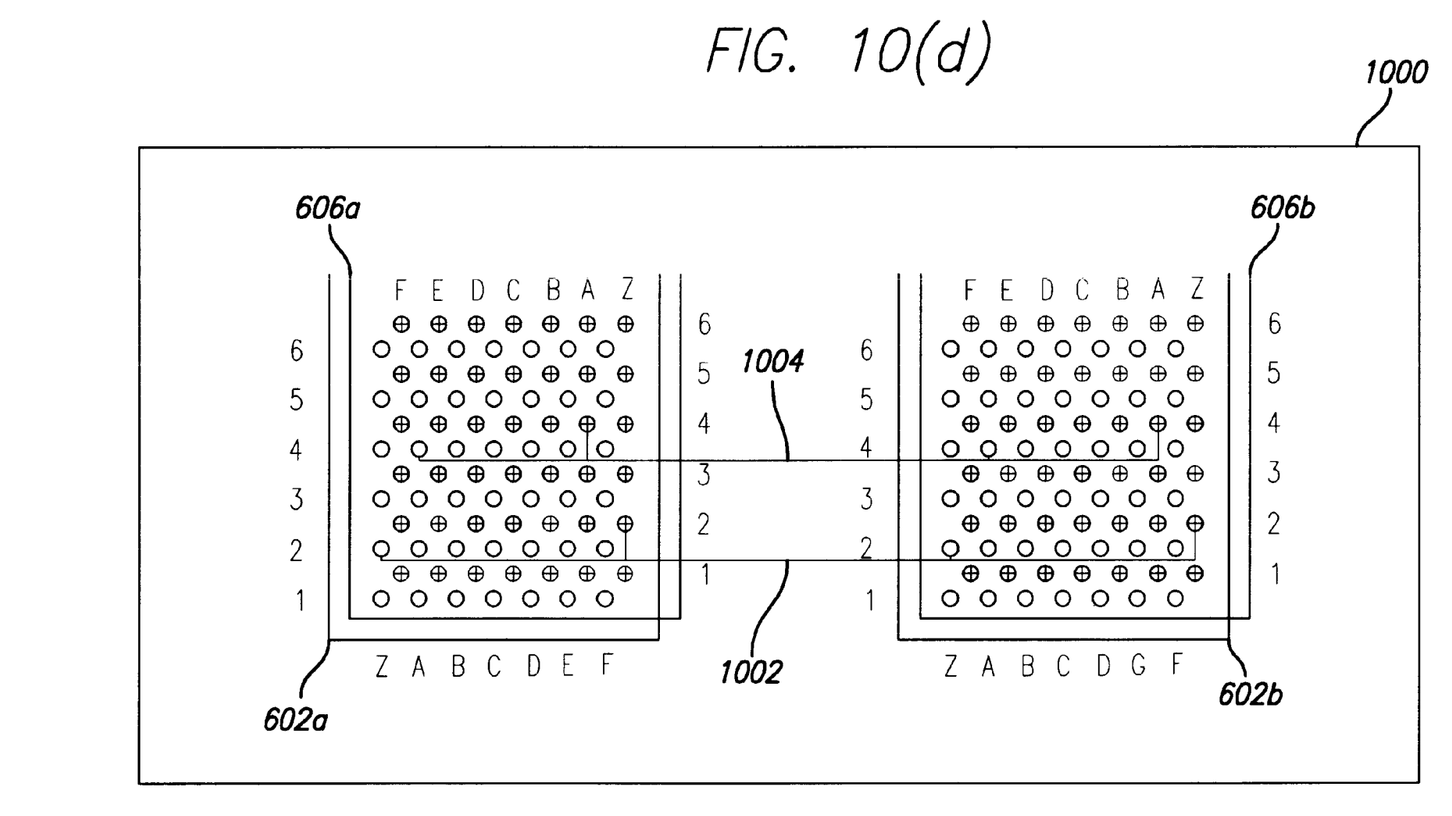
FIG. 10(d) shows an example of signal traces of the midplane of FIGS. 10(a) and 10(b) connecting corresponding connector-pins according to an embodiment of the invention.

Also, note that the corresponding/equivalent connector-pins of the 604a, 604b, 608a, and 608b connectors are electrically connected with signal traces in the midplane's printed circuit board (PCB) as illustrated in FIG. 10(d). FIG. 10(d) shows signal traces of a PCB connecting corresponding connector-pins according to an embodiment of the invention. Referring to FIG. 10(d), there is shown a PCB 1000 with front side slots 602a, 602b and back side slots 606a, 606b. As shown in FIG. 10(d), a signal trace 1002 electrically connects all of the connector-pins located at column Z, row in each of the slots 602a, 602b, 606a, 606b, and signal trace 1004 connects all of the connector-pins located at column A, row 4 in each of the slots 602a, 602b, 606a, 606b. In this manner, all of the corresponding/equivalent connector-pins of the 604a, 604b connectors of the front side slots 602a–602d and 608a, 608b connectors of the back side slots 606a–606d are electrically connected by signal traces of the PCB. This is because for a CPCI system, the first two connectors 604a, 604b of each front side slot and the first two connectors 608a, 608b of the back side slots are defined to carry the PCI signals, as described above.

Figure 11A:
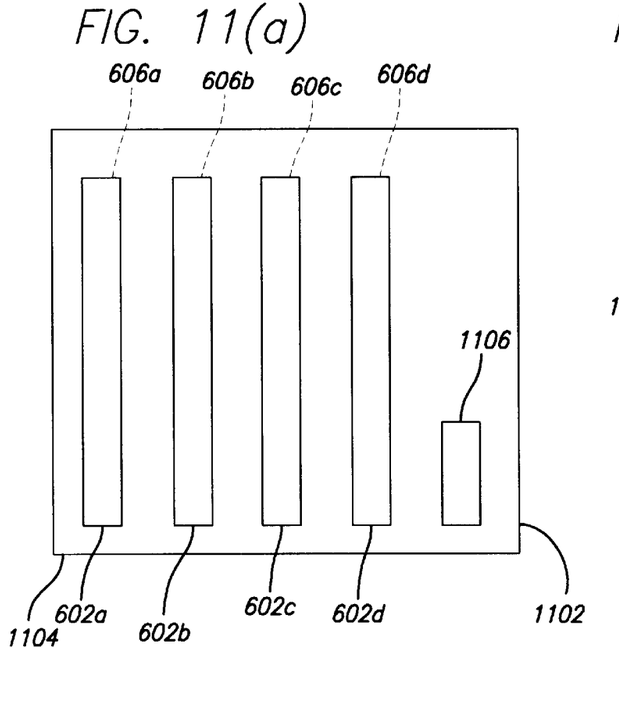
FIG. 11(a) shows an overlapped view of the respective slots of a dual-sandwiched midplane according to an embodiment of the invention.
Figure 11B:
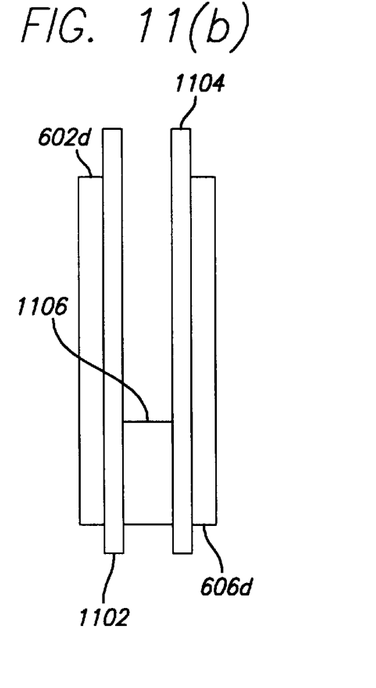
FIG. 11(b) shows a side view of the dual sandwiched midplane of FIG. 11(a)

FIGS. 11(a)–11(b) show a dual-sandwiched midplane implementation of an embodiment of the invention. Specifically, FIG. 11(a) shows an overlapped view of the respective slots of a dual-sandwiched midplane. Referring to FIG. 11(a), there are shown two midplanes 1102, 1104 that are sandwiched together in alignment with respect to each other, and a board-to-board connector 1106 electrically coupling the two midplanes 1102, 1104. Note that the slots 602a–602d are substantially aligned with slots 606a–606d such that there is substantially no offset between the slots 602a–602d and 606a–606d, respectively. The connector 1106 allows for sharing of the PCI signals from one board to another. In other words, the signals that are transmitted on the connectors 604a, 604b, 608a, 608b are shared between the midplanes 1102, 1104 via the board-to-board connector 1106.

FIG. 11(b) shows a side view of the dual-sandwiched midplane implementation of FIG. 11(a). Referring to FIG. 11(b), it can be also seen that the midplanes 1102, 1104 are in substantial alignment with respect to each other with substantially no offset. Although not shown, slots 602a–602c and 606a–606c are also in substantial alignment with respect to each other, respectively. In the present embodiment, the dual midplanes 1102, 1104 with their respective slots and connector configuration are laminated together so that there is no pass-through connection of the connector-pins 900a of the front side connectors and the rear side connector-pins 900b, and as described above, the board-to-board connector 1106 transmits the required signals between the two midplanes 1102, 1104.

Thus, the present invention uses pairs of equivalent pin-out, non-extended rear pin connectors on the backside of the plane, and the rear slots have connector-pin arrangements that are mirror images of the front side slots' connector-pin arrangements, and the CPCI daughter cards are pluggable in the rear side of the midplane instead of I/O transition cards.

Figure 12A:
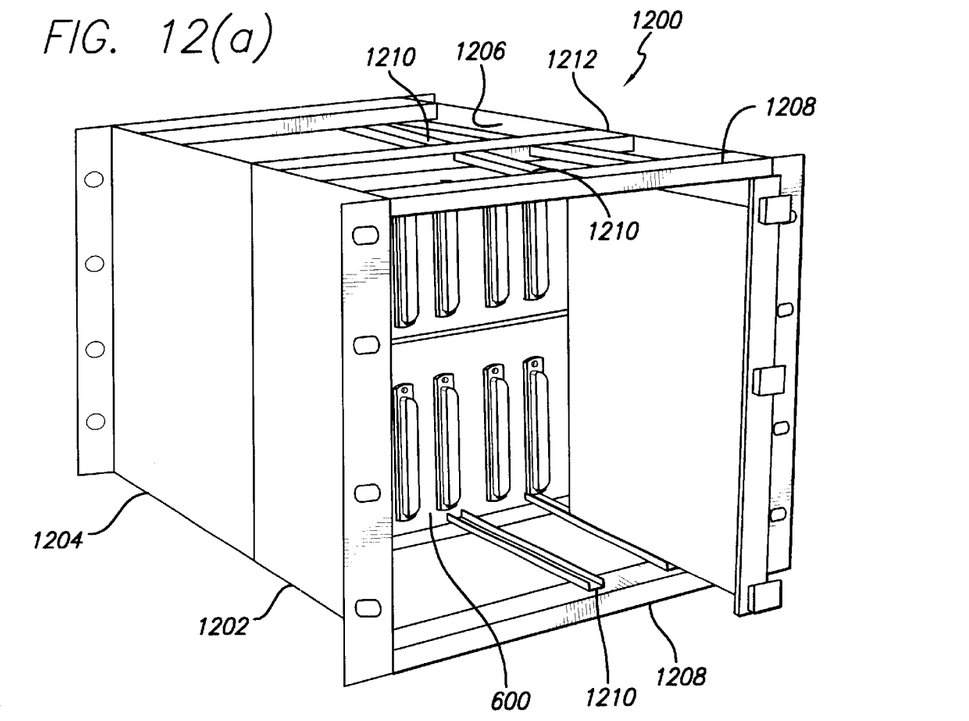
FIG. 12(a) shows a perspective view of a chassis according to an embodiment of the invention.

In another embodiment of the invention, a CPCI chassis is provided for accommodating the higher density midplane of the present invention. FIG. 12(a) shows a perspective view of a chassis according to an embodiment of the invention. Referring to FIG. 12(a), there is shown a chassis 1200 having a front card cage 1202 and a rear card cage 1204. Each of the card cages 1202, 1204 have side panels 1206, which are spaced apart and disposed parallel with respect to each other. On the top and bottom of the side panels and at their respective front edges, there are provided support members 1208 that provide support for the panels 1206. Perpendicular to the support members are card guides 1210 at the top and bottom of the chassis 1200 for guiding the add-on cards when they are inserted in the slots of midplane 600. In between the middle of the card cages is a board holder 1212 that holds the midplane 600 of the present invention.

Figure 12B:
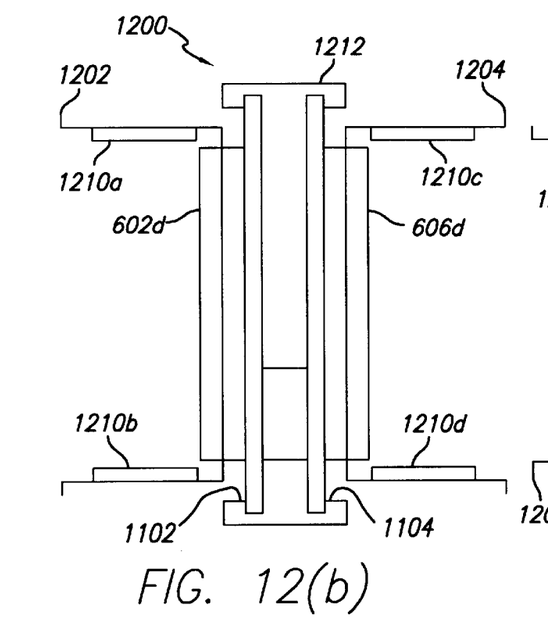
FIG. 12(b) shows a side view of the chassis of FIG. 12(a) for the dual midplane implementation of FIGS. 11(a) and 11(b)

FIG. 12(b) shows a side view of the chassis of FIG. 12(a) for the dual-sandwiched midplane implementation of FIGS. 11(a) and 11(b). Referring to FIG. 12(b), the top and bottom card guides 1210a–1210d of the front and rear card cages 1202, 1204 are in substantial alignment with respect to each other in both the vertical and horizontal directions. This is because slots 602d and 606d are also in substantial alignment with respect to each other so that the card guides 1210a, 1210b and 1210c, 1210d, respectively, also need to be in substantial alignment with respect to each other in order to properly guide the CPCI cards that are inserted through the front or back of the chassis 1200. The arrangement of the card guides as described above allows for proper mating of the cards with the slots 602d and 606d. Although not shown, the other card guides of the chassis 1200 are arranged in a similar manner as the card guides 1210a–1210d shown in FIG. 12(b). Additionally, note that the board holder 1212 accommodates both of the midplanes that are sandwiched together.

Figure 12C:
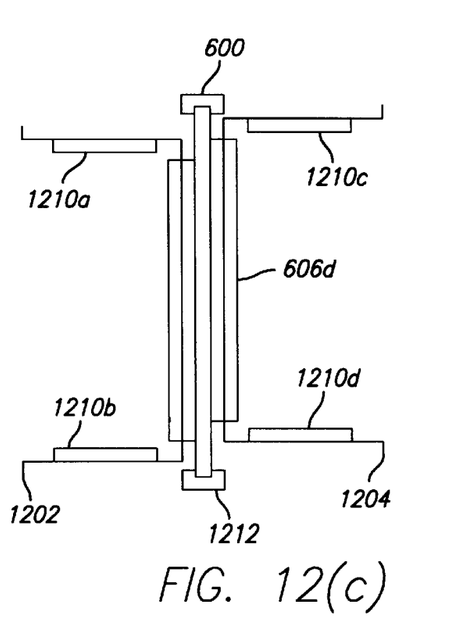
FIG. 12(c) shows a side view of the chassis of FIG. 12(a) for the single midplane implementation of FIGS. 11a and 11(b)

FIG. 12(c) shows a side view of the chassis of FIG. 12(a) for the single midplane implementation of FIGS. 10(a)–10(b). Referring to FIG. 12(c), the card guides 1210a, 1210b and 1210c, 1210d are offset in both the vertical and horizontal direction (not shown) with respect to each other. This is because slots 602d and 606d are also offset in both the vertical and horizontal direction with respect to each other, as shown in FIGS. 10(a)–10(b). So, in order to accommodate CPCI daughter cards that are being inserted from the front or back of the chassis, the card guides must also be appropriately offset with respect to each other. In other words, since the connectors of the slots on the back side are offset relative to the connectors of the slots on the front side, the rear card guides 1210c, 1210d in the chassis 1200 must be offset relative to the front side card guides 1210a, 1210b, respectively.

Conventionally, the connector-pins 900a, 900b are soldered to the midplane 600. But, in the present invention, the connector-pins 900a, 900b are "press-fitted". For example, the midplane 600 has holes that are of a particular size such that when a connector-pin is mounted onto the midplane 600, the connector-pin remains mounted by the mechanical friction between the pin and the hole. Press-fitting by a method of the present invention is performed by having the midplane lying on a table, which has clearances and cutouts so as to hold the midplane into place, as described below. Initially, a connector is hand-placed on the midplane such that the connector-pins are partially in the holes of the midplane but remain loose. Then, a wrench-like device pushes down on the connector so that it is physically pushed into the board so that every connector-pin is pressed and fits tightly with the holes. Next, the midplane is flipped over so that its front side is facing downward and the midplane is lying on the table. Finally, another set of connectors is hand-placed so that the connector-pins are partially in the holes of the midplane, but remain loose. Again, a wrench-like device pushes down on the connectors so that they are physically pushed into the board so that the connector-pins are pressed and fitted tightly with the holes.

Figure 13:
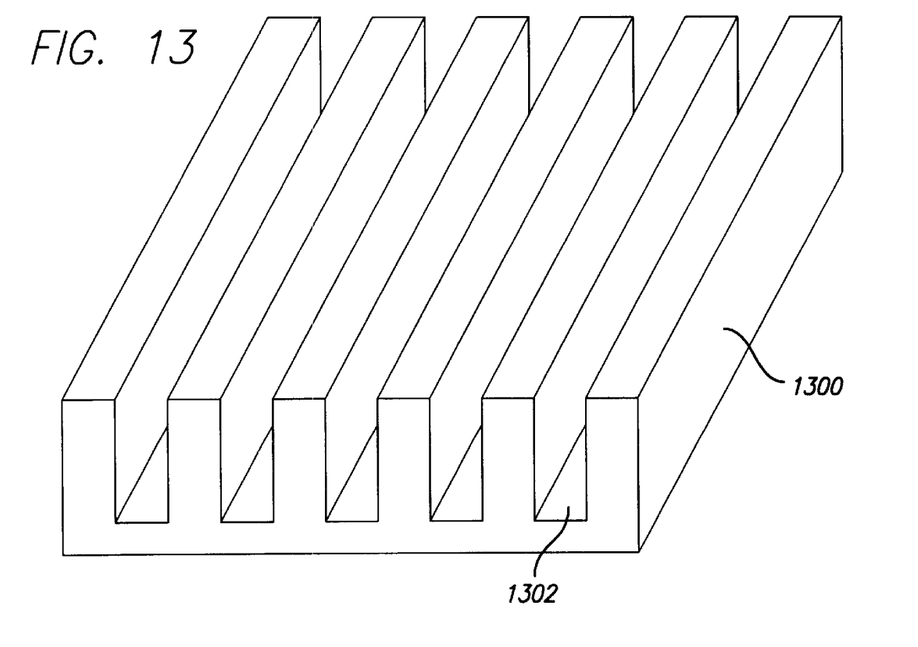
FIG. 13 shows a table for press-fitting the connector-pins to a midplane according to an embodiment of the present invention.

As can be readily seen from the above method, when the midplane has been press-fitted on one of its sides with connectors and is flipped over in order to press-fit the remaining side with connectors, a special table is needed to provide clearance for the already fitted connectors so that they don't become damaged when connectors are being pressed on the other side of the midplane. FIG. 13 shows a table for press-fitting the connector-pins to a midplane according to an embodiment of the invention. Referring to FIG. 13, the table 1300 has special cutouts 1302 so as to define clearances in order to allow the first set of connectors that are mounted on the front side of the midplane to clear when mounting connectors on the back side. For example, after the midplane has been mounted with connectors at one of its sides, the midplane is laid on top of the table 1300 so that connectors are hanging down from the midplane and located within the cutouts 1302. This provides clearance for the connectors so that when additional connectors are placed on the other side of the midplane and pressed, the already fitted connectors do not become damaged.

Having thus described a preferred embodiment of the present invention, it should be apparent to those skilled in the art that certain advantages of the within system have been achieved. It should also be appreciated that various modifications, adaptations, and alternative embodiments thereof may be made within the scope and spirit of the present invention. For example, a CPCI system has been illustrated, but it should be apparent that the inventive concepts described above would be equally applicable to other types of computer bus racks, circuit boards, and I/O busses. The invention is further defined by the following claims.

What is claimed is:

1. A computer bus rack including at least one circuit board, said at least one circuit board having a front side and a back side, said rack comprising:
   a first plurality of slots coupled to said front side, and a second plurality of slots coupled to said back side, said first and second plurality of slots being arranged such that corresponding ones of said first and second slots are in substantial alignment, respectively; and
   a plurality of connectors having a plurality of individual connector-pins extending in a direction substantially perpendicular to and away from said circuit board and having a column and row arrangement within said connectors so that the connectors can mate with add-on cards, said connectors affixed to said circuit board in alignment with said first and second plurality of slots, and each one of said plurality of connectors having connector-pins that are physically distinct from connector-pins of connectors of other slots.

2. The computer bus rack of claim 1, wherein said plurality of connectors aligned with each of said first and second plurality of slots is at least two.

3. The computer bus rack of claim 1, wherein said circuit board further comprises a midplane of a computer chassis such that add-on cards are insertable from a front and back of the chassis.

4. The computer bus rack of claim 1, wherein a first slot of said first plurality of slots substantially overlaps a first slot of said second plurality of slots such that said connector-pins of said first slot of said first slots are in substantial alignment with respect to connector-pins of said first slot of said second slots.

5. The computer bus rack of claim 4, wherein said substantial overlap of said first slot of said first slots and said first slot of said second slots include an offset of said first slot of said first slots with respect to said first slot of said second slots in at least one of a vertical and horizontal direction.

6. The computer bus rack of claim 4, wherein said substantial alignment of said connector-pins of said first slot of said first slots with respect to said connector-pins of said first slot of said second slots includes an aligned offset arrangement of said connector-pins with respect to each other in at least one of a vertical and horizontal direction.

7. The computer bus rack of claim 1, wherein said at least one circuit board includes a first circuit board and a second circuit board laminated together, and including a board connector electrically coupling said first and second circuit boards.

8. The computer bus rack of claim 1, wherein corresponding ones of said physically distinct connector-pins are electrically connected via respective signal traces of said circuit board.

9. The computer bus rack of claim 8, wherein said electrical connection of said corresponding ones of said connector-pins are connected according to PCI specification.

10. The computer bus rack of claim 1, wherein said connector-pins of said second plurality of slots are arranged as a mirror image with respect to said corresponding ones of said connector-pins of said first plurality of slots.

11. A computer chassis for housing a computer bus rack, said computer chassis comprising:

a front card cage and a rear card cage, each of said front and rear card cages including vertical side panels parallel to each other and spaced apart, top and bottom support members parallel with respect to each other and connected to said side panels at the top and bottom of said panels, respectively, and in a direction substantially perpendicular to said panels;

a plurality of pairs of card guides coupled to said top and bottom support members and extended perpendicular to said support members, wherein each of said pairs of card guides includes a first card guide coupled to said top support member and a second guide coupled to said bottom support member;

a board slot located at substantially a middle portion of said chassis and in between said first and second card cages; and a first midplane and a second midplane sandwiched together and disposed within said board slot, said first and second midplanes each having a first and a second plurality of connectors affixed to said first and second midplanes, respectively, each of said first arid second plurality of connectors having a plurality of individual connector-pins extending in a direction substantially perpendicular to and away from said circuit board so that the connectors can mate with add-on cards, wherein each of said plurality of connectors have connector-pins that are physically distinct from connector-pins of other connectors.

12. The computer chassis of claim 11, wherein said pairs of card guides include a first pair of card guides and a second pair of card guides, said first and second card guides of said first pair of card guides are in substantial alignment with respect to a first vertical plane and disposed within said front card cage, said first and second card guides of said second pair of card guides are in substantial alignment with respect to a second vertical plane and disposed within said rear card cage, and said first and second pair of card guides are offset with respect to each other in at least one of a vertical and horizontal plane that is common with said first and second pair of card guides.

13. The computer chassis of claim 11, wherein said first and second card guides of a first pair of card guides are arranged to be substantially aligned with respect to said first and second card guides of a second pair of card guides in at least one of a vertical and horizontal plane that is common with said first and second pairs of card guides.

14. A computer chassis for housing a computer bus rack, said computer chassis comprising:

a front card cage and a rear card cage, each of said front and rear card cages including vertical side panels parallel to each other and spaced apart, top and bottom support members parallel with respect to each other and connected to said side panels at the top and bottom of said panels, respectively, and in a direction substantially perpendicular to said panels;

a plurality of pairs of card guides coupled to said top and bottom support members and extended perpendicular to said support members, wherein each of said pairs of card guides includes a first card guide coupled to said top support member and a second guide coupled to said bottom support member;

a board slot located at substantially a middle portion of said chassis and in between said first and second card cages; and a midplane disposed within said board slot;

wherein said midplane comprises first and second slots coupled to first and second sides of said midplane, respectively; each of said first and second slots including a first and a second set of connectors each having a respective plurality of individual connector-pins extending in a direction substantially perpendicular to and away from said midplane and having a column and row arrangement within each said connector so that the connectors can mate with add-on cards, said connectors being affixed to said midplane in alignment with said first and second slots, and each one of said connectors having connector-pins that are physically distinct from connector-pins of connectors of other slots;

wherein said first slot substantially overlaps said second slot; and wherein said first slot and said second slot includes an offset of said first slot with respect to said second slot in at least one of a vertical and horizontal.

15. The computer chassis of claim 14, wherein said pairs of card guides comprise a first pair of card guides and a second pair of card guides and wherein said first slot is disposed so as to be in substantial alignment with respect to said first pair of card guides and said second slot is disposed so as to be in substantial alignment with respect to said second pair of card guides.

16. The computer chassis of claim 14, wherein the first and second set of connectors have an equal number of connectors.

* * * * *